United States Patent [19]

Edgerton

[11] 4,389,970

[45] Jun. 28, 1983

[54] APPARATUS FOR REGULATING SUBSTRATE TEMPERATURE IN A CONTINUOUS PLASMA DEPOSITION PROCESS

[75] Inventor: Robert F. Edgerton, Pontiac, Mich.

[73] Assignee: Energy Conversion Devices, Inc., Troy, Mich.

[21] Appl. No.: 244,389

[22] Filed: Mar. 16, 1981

[51] Int. Cl.³ .............................................. C23C 13/10
[52] U.S. Cl. .................................. 118/666; 118/718; 118/719; 118/723; 118/725; 427/39
[58] Field of Search ............... 118/666, 725, 718, 641, 118/723, 719

[56] References Cited

U.S. PATENT DOCUMENTS

| 2,785,082 | 3/1957 | Clough et al. | 118/718 X |
| 3,240,915 | 3/1966 | Carter et al. | 118/725 |
| 4,224,355 | 9/1980 | Lampkin et al. | 118/666 X |

Primary Examiner—John D. Smith
Assistant Examiner—Bernard F. Plantz
Attorney, Agent, or Firm—Lawrence G. Norris

[57] ABSTRACT

Apparatus for raising a continuous substrate to a predetermined deposition temperature and thereafter maintaining it at that temperature as it advances through a glow discharge chamber. A lamp holder having a plurality of heater lamps extends substantially the length of the chamber. The lamps are selectively spaced apart along the length of travel of said substrate to provide a desired heating profile. A detector is engaged to control circuitry for continuously adjusting the intensity of the lamps to regulate substrate temperature.

4 Claims, 13 Drawing Figures

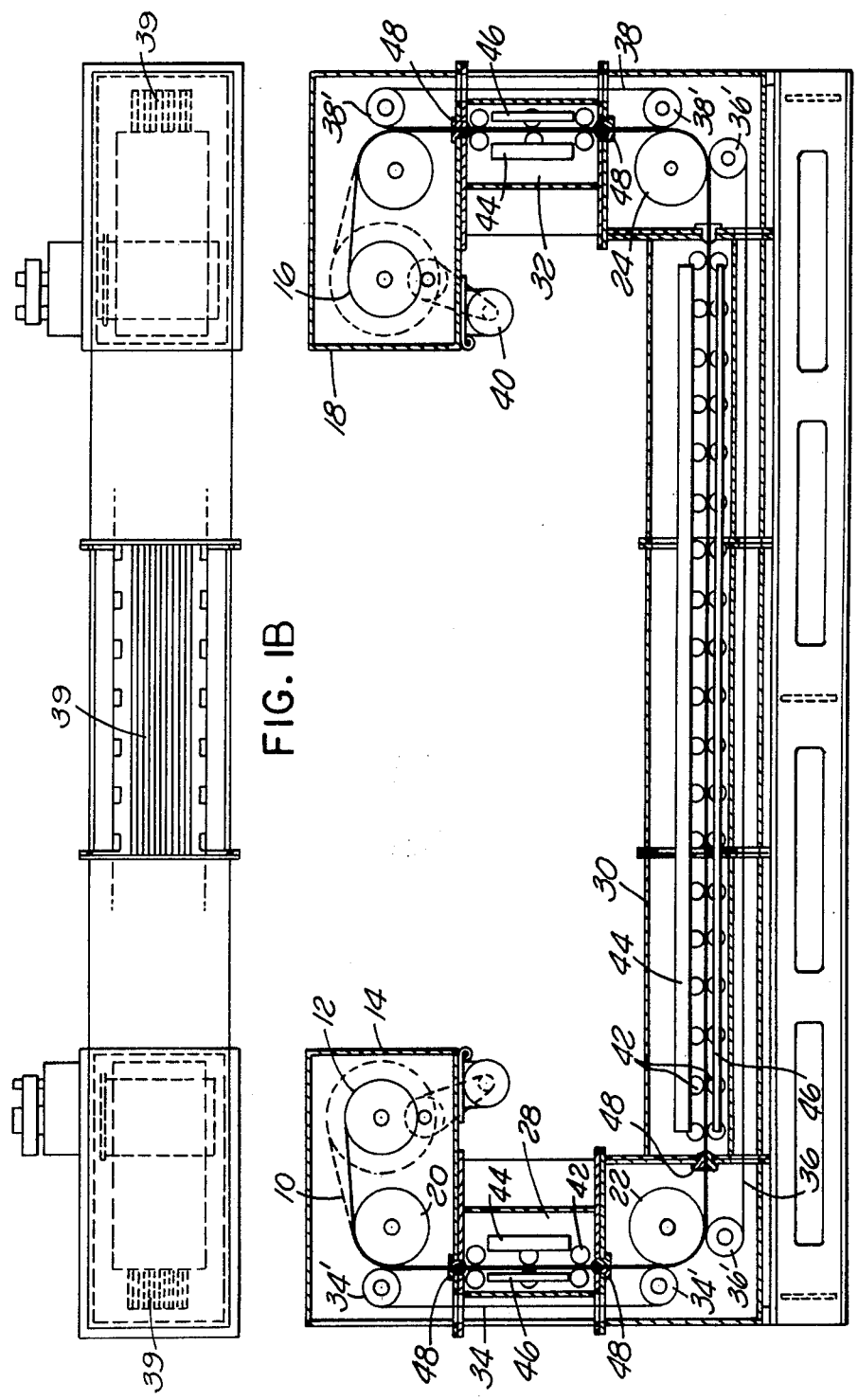

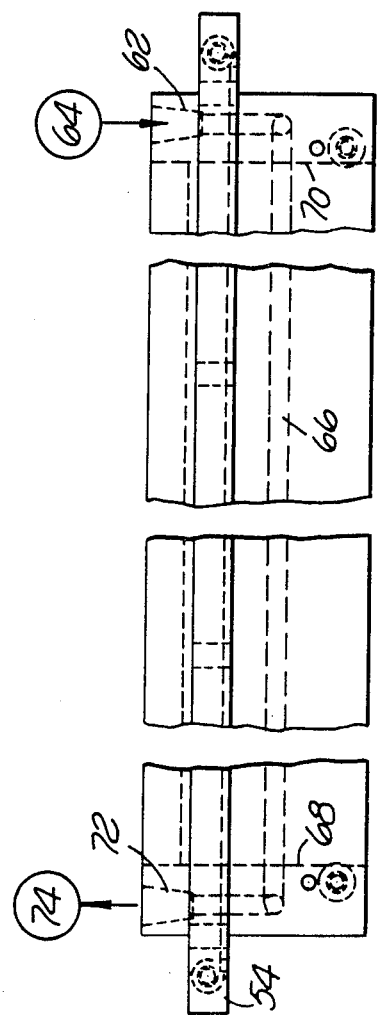
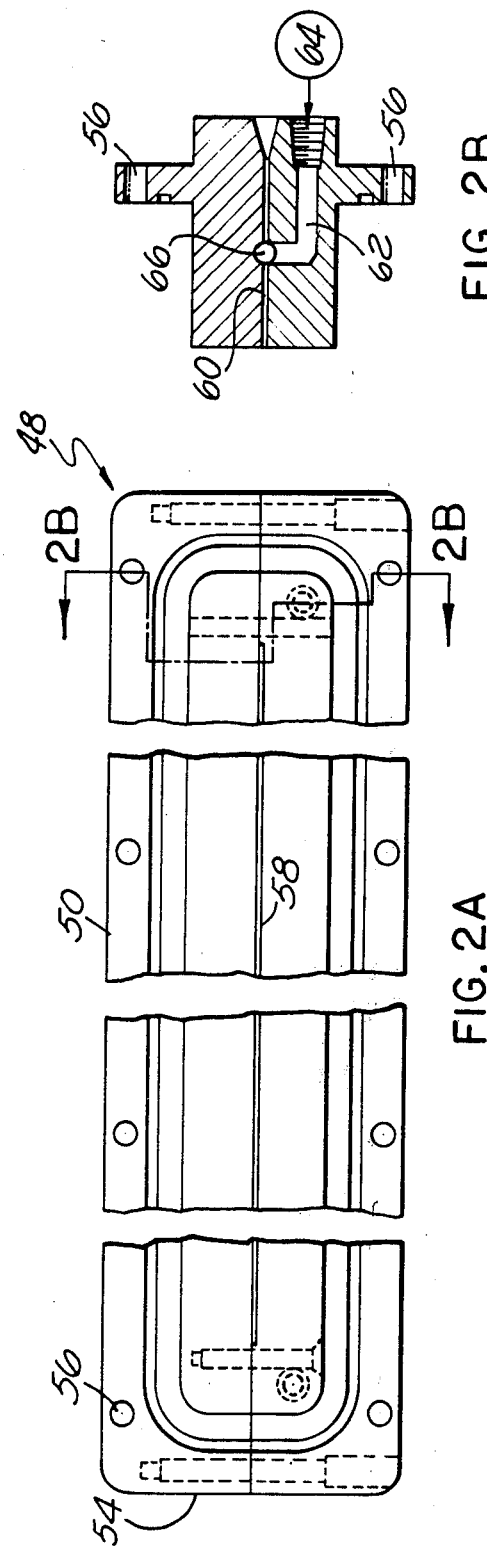
FIG. 2C
FIG. 2B
FIG. 2A

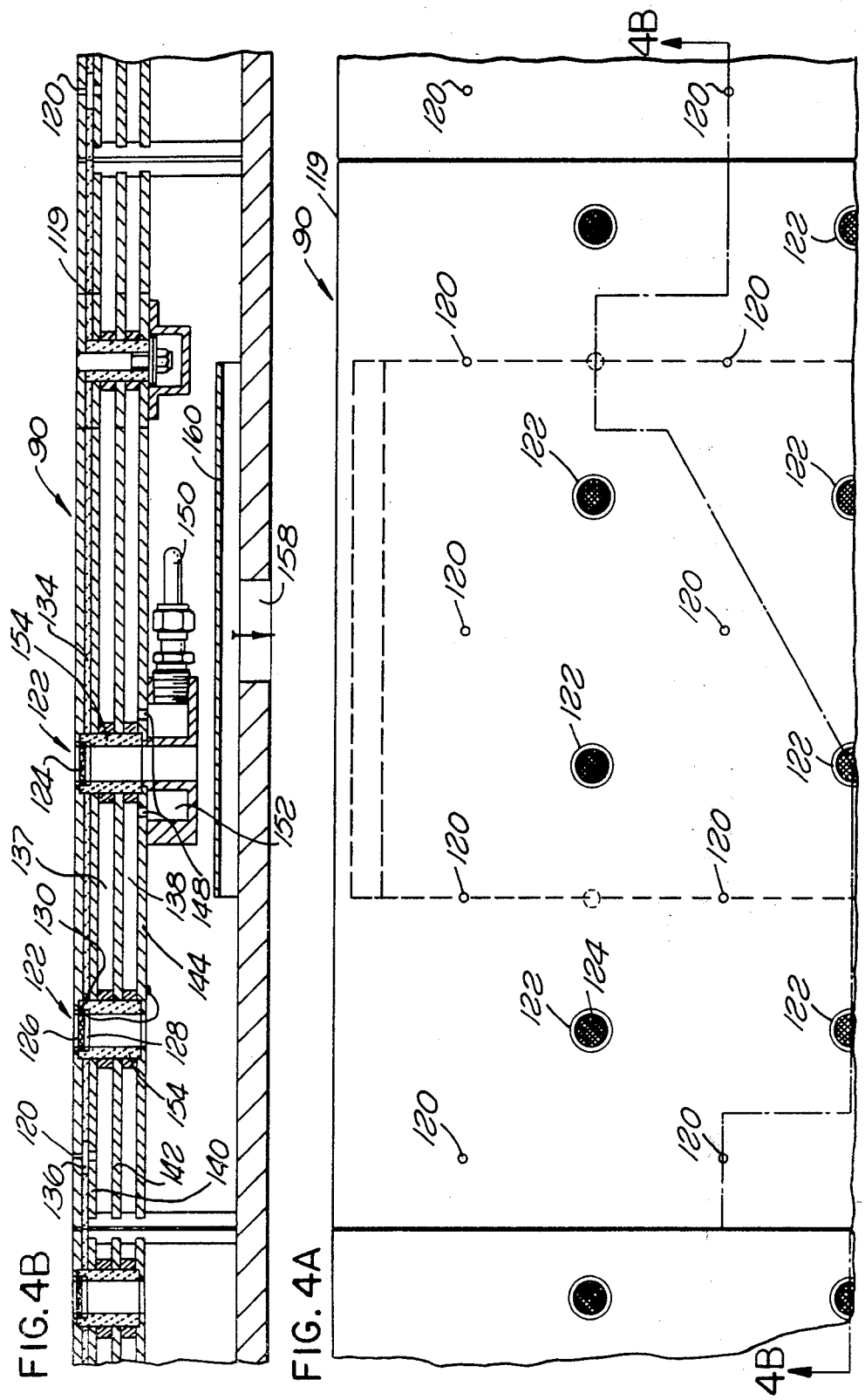

APPARATUS FOR REGULATING SUBSTRATE TEMPERATURE IN A CONTINUOUS PLASMA DEPOSITION PROCESS

BACKGROUND OF THE INVENTION

1. Field of the Invention

The present invention relates to apparatus and systems which may be utilized to mass-produce semiconductor devices. In particular, this invention pertains to the production of amorphous semiconductor devices by continuous, as opposed to batch, processing.

2. Description of the Prior Art

Crystalline materials which feature a regular lattice structure were formerly considered essential in the manufacture of reliable semiconductor devices. While solar cells, switches and the like having favorable characteristics continue to be so manufactured, it is recognized that preparation of crystalline materials introduces substantial costs into the semiconductor industry. Single crystal silicon and the like must be produced by expensive and time-consuming methods. Czochralski and like crystal growth techniques involve the growth of an ingot which must then be sliced into wafers and are thus inherently batch processing concepts.

Recent developments in the field of devices formed of amorphous semiconductor materials offer a potentially significant reduction in production costs. In particular, solar cell technology, which is dependent upon the production of a large number of devices to comprise a panel, is critically affected by processing economies. The feasibility of semiconductor devices produced by amorphous, as opposed to crystalline, materials is disclosed, for example, in U.S. Pat. No. 4,217,374 of Ovshinsky and Izu for "Amorphous Semiconductors Equivalent to Crystalline Semiconductors". A silicon solar cell produced by successive glow discharge deposition of layers of various conductivities and dopings and its process of manufacture are described in U.S. patent application Ser. No. 887,353 of Ovshinsky and Madan filed Mar. 16, 1978 for "Amorphous Semiconductors Equivalent to Crystalline Semiconductors", now U.S. Pat. No. 4,226,898. Both of these prior art patents are hereby incorporated by reference as representative of amorphous semiconductor technology.

The feasibility of amorphous devices becomes apparent in light of the drawbacks inherent in production of crystalline devices. In addition to the aforementioned inherently "batch" nature of crystal growth, a substantial amount of the carefully grown material is lost in the sawing of the ingot into a plurality of useable wafers. Substantial surface finishing and processing effort is often required thereafter.

Generally, the production of amorphous devices utilizes batch methods. As in the case of crystalline devices, such production methods impair the economic feasibility of amorphous devices such as solar cells by introducing "dead time" during which valuable equipment sits idle. Recently, efforts have been directed to the possibility of producing amorphous semiconductor devices by continuous processes. U.S. patent application of Izu, Canella and Ovshinsky for "Continuous Amorphous Solar Cell Production System" Ser. No. 240,493, filed 3-16-81 as the property of the assignee herein, discloses a system and method for the continuous production of solar cells of amorphous material. In that application, there is generally disclosed a system for advancing a weblike substrate of material through a plurality of modules to produce a plurality of solar cells.

SUMMARY OF THE INVENTION

The present invention enhances the quality of semiconductor devices produced in a continuous system by providing apparatus for regulating the temperature of the substrate as it travels through a glow discharge chamber. The invention provides a desired temperature profile, to a first approximation, by means of a heater having a plurality of heater lamps, each of which is arrayed with respect to the direction of advance of the substrate for radiantly heating the substrate directly. The lamps are selectively spaced apart as the web travels through the chamber. By such spacing of lamps, the substrate is initially heated then maintained at deposition temperature as it advances through the glow discharge chamber.

As a further feature, the invention includes a detector and means engaged thereto for adjusting the intensity of the heater lamps in response to the detected temperature of the substrate.

Other advantages and features of the present invention will become apparent from the following detailed description wherein like numerals correspond to like features throughout:

BRIEF DESCRIPTION OF THE DRAWINGS

FIGS. 1A and 1B are side and top sectional views of a continuous layer deposition system according to the present invention;

FIGS. 2A through 2C are front, cross-sectional and top views respectively of a slit valve according to the invention for applying an isolation curtain of inert gas at the entrance and exit of each chamber;

FIGS. 3A and 3B are side and cross-sectional views of a deposition chamber according to the present invention; and, FIGS. 4A and 4B are top and cross-sectional views of a cathode according to the present invention while

DETAILED DESCRIPTION

Figure 3A:
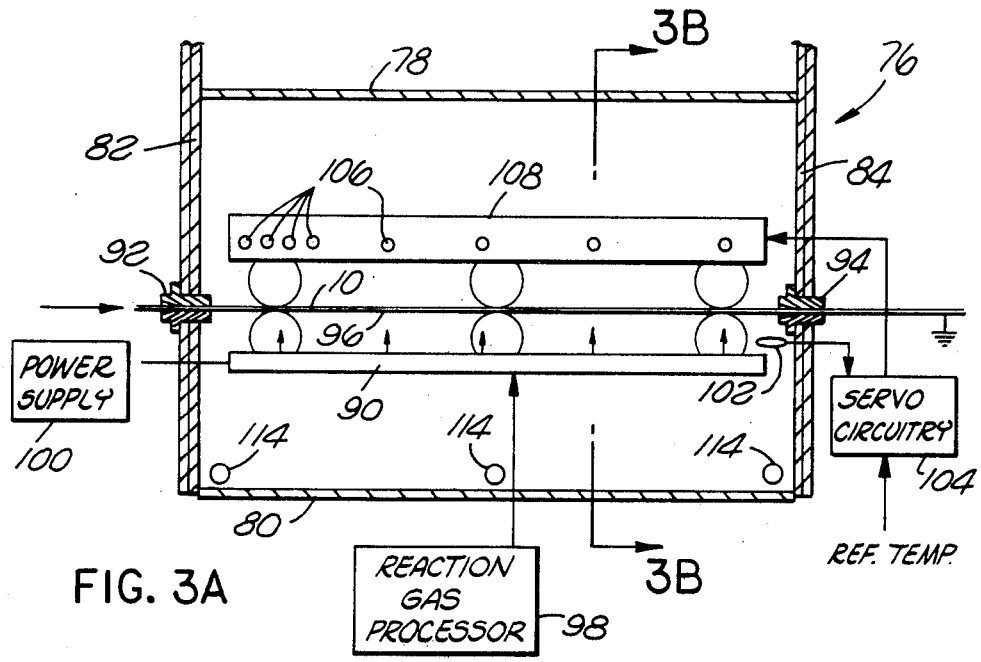

Referring now to the drawings, FIG. 1A is a side sectional view of a system incorporating the present invention. In a sense, it discloses an "assembly line" for the application of layers of amorphous semiconductor material to a flexible film substrate 10. The substrate 10, shown in edge view throughout FIG. 1A, comprises a continuous sheet of web-like material, preferably about one to four feet in width. As the invention is directed in effect to the deposition of a number of layers of amorphous semiconductor material, it represents an intermediate step in the processing of complete semiconductor devices. A complete device may additionally include other elements, the application of which requires particularized processing. Such processing may occur both prior to the placement of the substrate 10 (as a roll) on a reel 12 of a feed section 14 and subsequent to being gathered into a roll (a plurality of layers of amorphous semiconductor material having been deposited thereon) on a reel 16 of a takeup section 18.

In the production of solar cells in accordance with the present invention, a flexible metallic foil or metallic surfaced foil is utilized as the substrate 10. Certain device configurations may require a thin oxide insulating layer and/or a series of base contacts prior to the application of the layers of amorphous material. Thus, for the purpose of this description, the term "substrate" will be understood to include not only a flexible film, but also elements added thereto by such preliminary processing. Both preliminary and finishing steps in the processing of solar cells are disclosed in the patent application of Izu, Cannella and Ovshinsky.

The substrate 10, wound through the system of FIG. 1A from the feed reel 12 to the takeup reel 16 in a generally counterclockwise direction, is additionally guided by means of intermediate idler reels 20, 22, 24 and 26. In traversing the path they define, the substrate 10 passes through chambers 28, 30 and 32 wherein the closely regulated deposition of P-type, intrinsic, and N-type layers of amorphous semiconductor material takes place. Although the preferred embodiment of the system as illustrated contemplates the continuous production of PIN solar cells of amorphous silicon and the discussion will proceed upon such basis, it will be appreciated that changes of such variables as dopants and other constituents of the reaction gas, the sequence of chambers between the feed section 14 and the takeup section 16, and the like will result in a corresponding rearrangement of the cross section and effect redesign of the device produced. Thus, various devices can be produced in a continuous manner by the present invention wherein other constituents and deposition sequences are employed and such are considered within its scope.

The intrinsic (material) deposition chamber 30 is considerably longer than either the P-type layer deposition chamber 28 or the N-type layer deposition chamber 32. The continuous deposition processes therein require that the substrate 10 travel from reel 12 to reel 16 at substantially constant speed. As N-type, intrinsic and P-type layers are continuously deposited on various portions of the travelling substrate 10, the layer thickness, which is a function of the time spent within a given chamber serves, in large measure, to determine the relative lengths of the chambers.

The exemplary device produced by the system of FIG. 1A generally will produce thickness ratios in the range of 10 to 30:1 between the intrinsic and doped layers which occasions an intrinsic chamber of about sixteen feet in length and P- and N-type chambers of about two and one-half feet in length. Again, the manufacture of other devices having differing relative dimensions will dictate, to a large extent, appropriate chamber lengths.

If masking of the devices is desired, belt-like masks 34, 36 and 38 each including a plurality of strips (for example one inch wide), may expose corresponding strip-like areas across the width of the substrate 10 as it travels through the chambers 28, 30 and 32. The strips 39 which comprise the masks are seen in FIG. 1B, a partially sectioned top view of the system of FIG. 1A. Each of the masks 34, 36 and 38 circulates between a pair of rollers 34', 36' and 38', respectively. The pairs of rollers 34', 36' and 38' may be either independently driven or geared to the mechanisms of the reel-to-reel advance which drives the substrate 10 through the system. In either event, appropriate synchronization is maintained between the masks and the traveling substrate 10 to assure proper alignment of the deposited layers.

An appropriate amount of tension must be maintained within the travelling substrate 10 for proper registration with the masks 34, 36 and 38. The amount of tension, however, must be carefully regulated as it is believed that excessive or insufficient tension may cause improper positioning or travelling of the web substrate which in turn may cause damage to the substrate 10 or the material deposited thereon. The servocontrolled motor drive engaged to the feed reel 12 controls the tension throughout the substrate 10. The motor drive 40 engaged to the takeup reel 16 is continually adjustable to provide an optimum rate of travel of the substrate.

Close proximity contact is desired between the masks 34, 36 and 38 and the advancing substrate 10. In a common PIN solar cell of the type fabricated by the system of FIG. 1A, P- and N-type layers of minute thickness assure that leakage (from separation of mask and substrate) around the strips is likely to be of little significance. The maintenance of relative intimate contact between the substrate 10 and the mask 36 during intrinsic layer deposition is critical due to the relatively thick intrinsic layer. As seen in FIG. 1A, the deposition of intrinsic material occurs in the horizontally-oriented chamber 30. It should be understood that the horizontal disposition of the chamber 30 is not considered critical and that any elevational position desired may be employed. A natural sag occurs in the substrate 10, which is also horizontal when it passes therethrough, resulting in a degree of displacement along its length throughout the chamber 30. It has been found that as much as $\frac{3}{8}$ of an inch of such sag may occur as it travels through the sixteen foot horizontal chamber 30.

As shown in FIG. 1A, a plurality of paired pinch rollers 42 acts as an edge guide and web-tensioner for the advancing substrate 10. The rollers 42 are an optional feature. When utilized, one need not rely upon the natural sag in the substrate 10 but can more reliably adjust the position of the substrate and the mask 36 for proper proximity masking.

Each of the chambers 28, 30 and 32, through which the substrate 10 is advanced, includes a lamp holder 44 for retaining a plurality of quartz infra red lamps on one side of the substrate 10 and a cathode 46 (for energizing a plasma) on the other side of the substrate 10. It will be seen that the reaction gases enter each chamber through a cathode which additionally includes means for maintaining uniform gas pressure at the surface of the substrate 10. A separation valve 48 is located at the entrance and exit of each of the deposition chambers. These valves, discussed in greater detail infra, allow the passage of the continuous substrate and mask from chamber to chamber without contaminating the reaction gas environment of each chamber. Control means (not shown in FIG. 1A) associated with each of the chambers, will be disclosed with particular reference to FIGS. 3A and 3B.

FIGS. 2A through 2C are detailed views of one form of a separation valve for use in and according to the present invention. The valve allows the passage of the travelling substrate 10 into and out of each of the chambers; at the same time, it provides a curtain of inert gas to isolate the gas environment of each chamber from each other chamber. Particularly, contamination of the intrinsic deposition chamber by dopant gases present in the other chamber is prevented, which is essential to the manufacture of a high efficiency device.

FIG. 2A is a front elevation view of a separation valve. The valve is formed of a pair of matching manifolds 50, 52. A flange 54 encircles the manifolds 50, 52 when joined together to complete the valve. A plurality of holes 56 therein allows the valve to be bolted, riveted or the like to an aperture in either the front or back wall of a chamber. A groove 58 is machined into the mating surface of the lower manifold 52. The groove 58 is centrally positioned to form a centrally-located slit 60 or opening in the valve when the manifolds 50, 52 are joined together. The slit 60 provides communication between a chamber wall and the rest of the system allowing entry and/or exit of the continuously-moving substrate 10 (and associated mask if such is employed).

Turning to FIG. 2B, a side elevational view in cross-section taken along the line 2B—2B of FIG. 2A, is provided and one can see that the slit 60 is flared or bevelled to assist the initial threading of the substrate therethrough. To further protect the substrate from harm or degradation as it passes through the slit 60, the opposed (top and bottom) surfaces thereof are coated with teflon or like lubricant. An appropriate protective layer of teflon may be provided by spray deposition and subsequent baking at 600 degrees Centigrade. In the system of FIGS. 1A and 1B, the substrate 10, upon passage through the slit 60, is oriented with its active surface facing downward. In this orientation, the valve 48 is located so that the advancing substrate web does not touch the groove 58 at the bottom of the slit 60, but may brush against its opposed side.

A gas inlet channel 62 provides communication between a source of inert gas 64 and a cylindrical groove 66 which is at least coextensive with the width of the slit 60. This configuration may be seen most readily in FIG. 2C which is a top plan view of the valve 48. The width of the slit 60 is defined by the distance from the dashed line 68 to the dashed line 70. The cylindrical groove 66, one-half of which is formed in the upper manifold 50 and the other half of which is formed in the lower manifold 52, communicates at either end with a gas inlet channel 62 and with a gas outlet channel 72. As referenced above, the gas inlet channel 62 is in communication with a source of inert gas 64 whereas the gas outlet channel 72 is connected to a vacuum pump 74.

The gas source 64 and the vacuum pump 74 interact to maintain the flow of an inert gas, such as argon, within the cylindrical groove 66 at a pressure somewhat greater than the pressure within the deposition chamber. In this manner, a gas curtain is formed in the interior of the valve to prevent cross contamination of the reaction gases and, more important, the entry of dopant gases into the intrinsic deposition chamber. Such dopant gases even in minute amounts, can degrade the intrinsic material which would adversely effect cell performance.

While isolation of the interior of the chamber is the prime object of the valve 48, a significant amount of inert gas within the chamber can interfere with the deposition process. For this reason, the gas pressure within the cylindrical groove 66 is maintained only slightly above that of the chamber (about 1 Torr). Impedance to the escape of the inert gas into the chamber is increased as the length (along the direction of travel) of the narrow portion of the slit 60 (seen best in FIG. 2B) is increased. Thus, the design of the cross-section of the slit 60 in accordance therewith will serve to minimize the escape of the inert gas from the groove 66 into the interior of a chamber.

FIG. 3A is a side elevational view partly in cross section of a deposition chamber 76. A controlled environment is maintained at its interior for the glow discharge decomposition process and resultant plasma/substrate equilibrium. The chamber is defined by top and bottom walls 78 and 80 riveted or otherwise joined to front and rear walls 82 and 84 and to side walls 86 and 88. All of the walls are preferably of a metal or metallic alloy which is nonreactive with the various gases to be introduced into the chamber. As the plasma generated by the decomposition of the reaction gases is confined to the area between the cathode 90 (whose potential is regulated by an RF power source 100 to create the required field between the cathode 90 and the grounded substrate 10) and the moving substrate 10, essentially no amorphous material is deposited on the walls of the chamber.

Slit separation valves 92 and 94 are located in the front and rear walls 82 and 84, respectively, of the chamber 76. The valves, discussed above, allow passage of the substrate 10 and the plurality of strips which comprise the offset masking 96, if used, through the chamber 76.

As the substrate 10 passes through the chamber 76, the deposition process is closely regulated on a continuous basis. That is, the essential variables of the production process, and the resulting product, are continually monitored and fed back to various corrective controls. The chamber 76 is idealized in that it contains a full complement of apparatus for controlling the various process parameters including film thickness. The chamber 30 of FIG. 1A, for example, includes means for detecting film thickness of the intrinsic amorphous silicon layer. As previously mentioned, the intrinsic layer is approximately 10 to 30 times as thick as either of the P-type or N-type doped layers. Even though the doped layers are relatively thin, the detection and measurement of the thickness of those layers may also be accomplished.

The various reaction gases, which should include a compound of silicon such as $SiF_4$ or silane and at least one alterant element such as fluorine or hydrogen which acts to reduce the density of localized states in the energy gap to produce a layer of material having electrical properties which closely resemble crystalline silicon, are introduced into the chamber 76 by means of a reaction gas processor 98. The processor 98 includes a supply of appropriate reaction gas and means for evacuating the spent or unreacted gases from the interior of the chamber 76. In addition, the processor 98 preferably includes scrubbing means and the like for reclamation of the reaction gases.

The reaction gas processor 98 is coupled to the cathode 90. The cathode 90, discussed below, includes unique baffling means so that, in addition to providing an equipotential surface for the formation of a uniform plasma induced by an electric field, it provides a uniform flow of reaction gas across the surface of the substrate and a uniform removal of the spent gases. The uniformity of the gas flows assures the deposition of the amorphous material having uniform electrical and optical properties across the surface of the substrate. The substrate 10 should be maintained at a fixed potential, as for example, ground potential throughout the system as disclosed herein to allow the formation of an appropriate electrical field between the substrate and the cathode 90.

A detector 102 is located in the chamber 76. The detector 102 may be either an optical pryrometer or a thermocouple supported by a mounting bracket adjacent to the moving substrate. The detector 102 has a responsivity to radiation of about five microns in wavelength and is coupled to servocircuitry 104 which controls a plurality of quartz infra red lamps 106 contained within a lamp holder 108. The spacing between the lamps becomes larger as one progresses from the heating region to the constant temperature region through the chamber 76 from entrance to exit. This pattern accomplishes, in a first approximation, the relatively quick heating of the substrate to a desired temperature such as about 300 degress Centigrade upon entrance into the chamber 76 and its subsequent maintenance thereat for optimum deposition upon exposure to the plasma. The infrared detector 102 is chosen for peak sensitivity at a wavelength of about five microns as a result of the fact that such wavelength is the peak where 300 degrees Centigrade obtains maximum radiation. The servocircuitry 104 utilizes the radiation pattern for 300 degrees Centigrade to generate an error signal which it then converts to a current to regulate the intensity of the quartz infra red lamps 106 within the lamp holder 108.

Figure 3B:
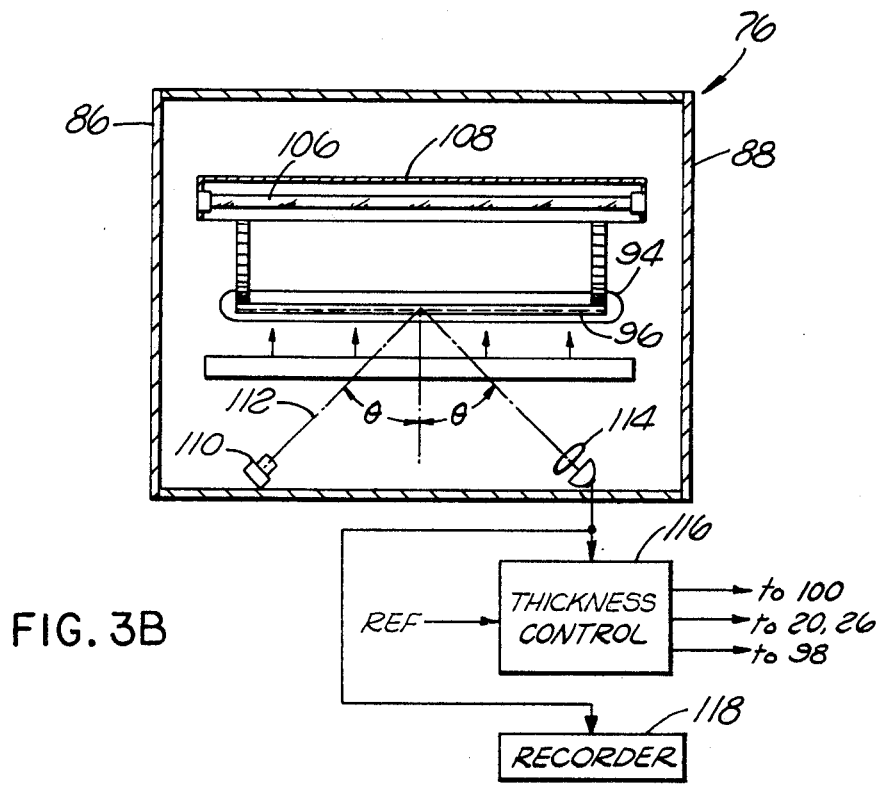

FIG. 3B is a cross-sectional view of the chamber 76 taken along line 3B—3B of FIG. 3A. One can see that a source of a radiant beam energy 110 is located therein. Energy emerging therefrom is projected along optical axis 112 to an optical detector 114 after reflection from the substrate 10. The optical detector 114 may include focusing optics and a monochrometer in the event that the source 110 radiates white light; alternatively, the source 110 could be a laser and the detector 114 a detector of laser energy.

The combination of the source 110 and the detector 114 is utilized in the present system to detect the thickness of the layer deposited upon the substrate 10. Although only one paired source-and-detector combination is shown in FIG. 3B, one can see from FIG. 3A that a plurality of detector/source combinations is envisioned in the present invention. Each detector 114 is engaged to a thickness control circuit 116. The circuit 116 accepts the output of the detector, processes the signal through appropriate amplifiers, wave analyzers and the like and then applies the signal to a feedback or servocontrol circuit which operates against a referenced thickness indicator. The reference thickness is a function of the particular location of the source/detector combination along the path of travel of the substrate 10. Thickness control circuitry 116 may equivalently include an appropriately programmed microprocesser; in either event, the thickness control circuit 116 derives signals for altering the RF power and/or the speed of the web and/or the valves controlling gas flow upon detection of a thickness which is not appropriate for the stage or location of the detector 114. The control of the above-referenced variables is indicated by the multiple outputs of the control circuitry 116: the power source 100 (RF power control); drives of intermediate reels 20, 26 (web speed control); and reaction gas processor 98 (valving).

The output of the detector 114 is additionally applied to a recorder 118 which includes appropriate circuitry for decoding its output to produce a histogram of thickness so that, in the event portions or segments of the substrate are unusable, they may be easily located, sectioned from the final product, and removed. If white light, as opposed to laser light, is utilized in the thickness detection system, the optical detector and its associated control circuitry can be based upon the principle of thin film interference effects. When energy from a source of white light is reflected from a surface, such as the substrate 10, the thickness of the layer from which it is reflected may be determined by comparing the intensity as a function of wavelength of the reflected beam with that of the incident beam. The equation for calculation of the thickness of the deposited film is:

$$d = \frac{N_{\lambda_1 \lambda_2}}{2\left[ n_1 \sqrt{\left(1 - \frac{\sin^2 \theta}{(n_1)^2}\right)} \lambda_2 - n_2 \sqrt{\left(1 - \frac{\sin^2 \theta}{(n_2)^2}\right)} \lambda_1 \right]}$$

where
d = layer thickness
N = number of similar extrema of intensity displacing wavelength $\lambda_1$ from $\lambda_2$
$\lambda_1$ $\lambda_2$ = wavelengths at chosen extrema of intensity
$n_1$ $n_2$ = index of refraction of layer material
$\theta$ = angle of incidence at wavelength $\lambda_1$ and $\lambda_2$
This equation applies rigorously at normal incidence.

A reference may be applied to the control circuit 116 corresponding to a desired thickness. Circuitry within the thickness control 116 converts the measured reflectance spectrum into a usable error signal which the control 116 continuously drives toward zero by applying corrective signals to any or all of the RF power source 110, the intermediate reel drives 20 and 26 and the reaction gas processor 98. The details and design of servocontrol circuitry appropriate for generation of control signals in response to an error signal in the above manner is considered conventional and well known in the electronics and electromechanical arts both in terms of configuration and the elements required.

In the event that monochromatic light such as a laser, is employed, the thickness control circuit 116 is calibrated to count the number of reflection extrema changed (peaks and valleys of intensity of reflected light). As is well known, the number of changes in intensity corresponds to a predetermined thickness. Therefore, each detector arrayed in the chamber should detect a different intensity of reflected light according to its location along the deposition "assembly line." The changes in intensity can thus act as the reference input for the control circuit 116 in the same manner that the preselected thickness and pattern of interference colors provides a reference for the generation of an error signal when white light is employed. In either event, the circuit 116 functions to provide appropriate control signals in response to the error signals.

FIGS. 4A through 4F relate to the cathode 90 of the invention. The cathode 90 serves the dual functions of (1) an electrode for the glow discharge process and (2) a conduit for the flow of fresh reaction gas to and for the evacuation of the spent reaction gas from the plasma region to maintain a uniform, constant pressure glow discharge. It includes a top electrode plate 119 which is electrically connected to the RF power source 100. A plurality of gas inlet openings 120 are uniformly arranged on the electrode plate 119. The openings 120 allow the application of a uniform flow of fresh reaction gas to the surface of the substrate 10 (which serves as the anode of the glow discharge process).

Uniformly spaced between the gas inlet openings are a plurality of exit vents 122 for collection of spent reaction gases. The vents 122 communicate with the vacuum means of the reaction gas processor 98, providing a uniform removal of spent gases from the area between the substrate and the cathode. A screen 124, preferably of stainless steel, is associated with each of the exit vents, enhancing the uniformity of exit gas flow by providing a plurality of uniformly-spaced openings at the exit vent 122. The screen 124 is additionally useful for the collection of solid contaminants.

The screen 124 is retained between a pair of stainless steel rings 126 and 128. An insulating washer 130 surrounds the screen 124 and provides electrical insulation between the rings 126 and 128. The screen 124 and the lower ring 128 are grounded, as shown, to a lower baffle member, discussed below. The grounding of the screen isolates the pump out region from the active plasma region between the electrode plate 119 of the cathode 90 and the advancing substrate 10. By grounding these regions, spent reaction gases are evacuated through a dark space so that generation of the plasma is confined to the region between the electrode plate 119 and the substrate 10.

An insulator such as a sheet of ceramic paper insulation 134 is located adjacent the electrode plate 119. A plurality of openings 136 allows the flow of gas therethrough. The openings 136 are mated both with the gas inlet openings 120 and the exit vents 122 of the electrode plate 119. Gas distribution chambers 137 and 138 are located beneath the top electrode plate 119. The chambers 137 and 138 are bounded and formed by top, middle and lower baffle plates 140, 142 and 144, respectively. The baffle plates are illustrated in plan view in FIGS. 4C, 4D and 4E respectively. By viewing the three plates simultaneously, one can observe that each contains a plurality of holes 146 having cross-section equal to that of the exit vents 122 and arranged thereon so that, when assembled, the holes 146 are aligned with the exit vents 122 of the electrode plate 119. On the other hand, one may observe that the pluralities of holes 148 which serve as gas inlet openings are arranged in various patterns throughout the three baffles 140, 142 and 144. The purpose of this deliberate misalignment from baffle to baffle is to assure that inlet gases applied to the chambers 136 and 138 will travel an equal distance from a gas inlet 150 to the substrate 10 to equalize the reaction gas pressure across the surface of the substrate 10.

Reaction gases enter the system through the inlet 150 which communicates with the reaction gas processor 98. A donut-shaped chamber 152 accepts the reaction gases and allows their eventual passage into the lower gas distribution chamber 138 through the gas inlet holes 148 of the lower baffle plate 144. In such a manner, the reaction gases enter the lower gas distribution chamber, filling it until sufficient pressure causes subsequent flow (through the regularly spaced inlet holes of the middle baffle plate 142) into the upper gas distribution chamber 136. The gas remains in the upper chamber 136 until sufficient uniform pressure once again results in its flow (through the holes of the top electrode plate 118) into the area between the cathode 90 and the substrate 10. The plasma is generated in and confined to this region by the interaction of the electrical field (imposed between the electrode 119 and the substrate 10) with the reaction gases.

A portion of the reaction gas is spent or unused during the glow discharge decomposition process. Means are provided in the cathode 90 for evacuating this spent gas in a uniform manner so that uniformity of the plasma chemistry over the entire surface area of the substrate is maintained. Cylindrical, electrically insulative gas exit ports 154 of ceramic or the like extend the passageway for spent gases from the plasma area through the exit vents 122 and into a vacuum chamber 156. The ports 154 are aligned with the gas exit holes 146 of the baffle plates 140, 142 and 144. The chamber 156 communicates with the vacuum or pumping means of the reaction gas processor 98 through an exhaust port 158. A baffle 160 is provided above the exhaust port 158 to equalize the flow paths of exhaust gases from the exit vents 122 to the exhaust port 158 and to minimize any surface pressure differential resulting from the evacuation process. It has been found that, in utilizing a cathode 90 according to the present invention, an extremely uniform layer of amorphous material having uniform electrical properties is deposited upon the substrate. It is believed that the fact that all of the reaction gas must travel the same distance from the gas inlet 150 to the gas inlet openings 120 of the electrode plate 119 and that the spent reaction gas travels a substantially uniform distance from the plasma area to the exhaust port 158 assures a uniform pressure as well as a uniform plasma chemistry at the surface of the substrate 10. It is further believed that this uniform pressure and plasma chemistry contribute substantially to the uniform deposition of layers and to the uniform electrical properties such as photoconductivity and dark conductivity of the deposited layers. Such uniformity has not been found to occur when reaction gas is applied to large area substrates by means of laterally-spaced manifolds according to the prior art.

Figure 4E:
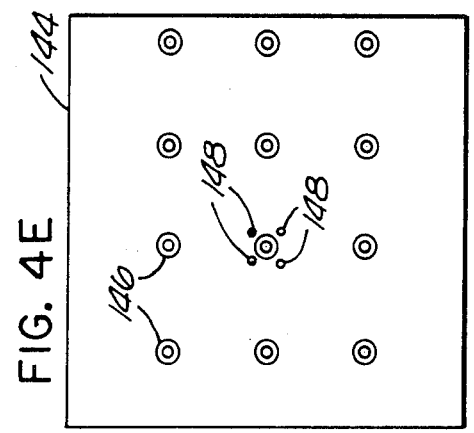
FIGS. 4C through 4E are plan views of the internal baffle plates of the cathode and FIG. 4F is an alternative embodiment of the cathode.
Figure 4D:
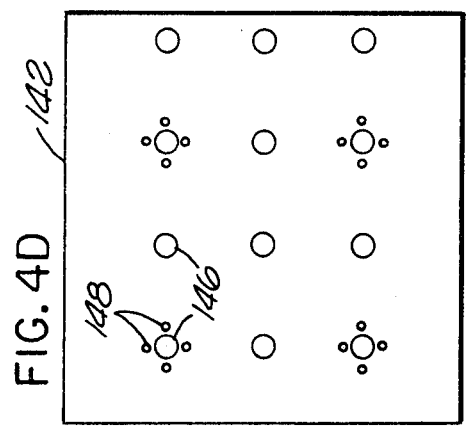
Figure 4C:
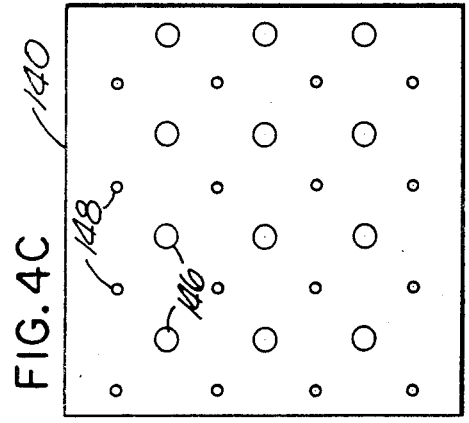
Figure 4F:
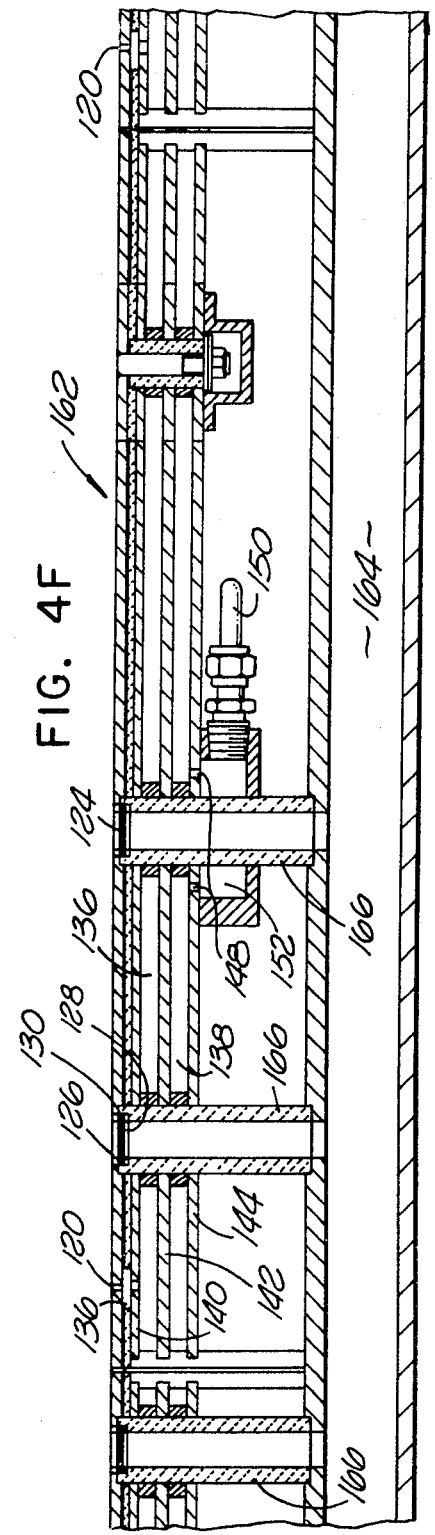

An alternative embodiment 162 of the cathode is shown in cross-section in FIG. 4F. The cathode 162 differs from that of FIG. 4A by the addition of a chamber 164 for spent gases. In addition, gas exit ports 166 are seen to extend through the region formerly comprising the vacuum chamber 156. Equal flow paths may be obtained in this embodiment by the provision of a plurality of baffles within the chamber having non-aligned holes therein to create subchambers in the manner of the gas distribution chambers 136 and 138 employed to equalize the flow paths of entering reaction gas.

In operation, deposition occurs simultaneously in the chambers 28, 30 and 32 in the plasma regions. In between the plasma regions of the chambers, adhering molecules of reactive gases are removed from the substrate 10 by means of the gas curtain associated with the opening in the chamber separation valves. Once within a chamber, the electrically grounded substrate 10 advances through the plasma region bordered by the substrate and the cathode of the chamber. The overall cathode may consist of a plurality of modules identical to those illustrated in FIGS. 4A through 4F to present a relatively large surface area in the aggregate. This relatively large area contributes to the uniformity of the layer deposited by reducing the edge effects that often complicate deposition.

As the substrate 10 advances through the plasma region, a uniform flow of fresh reaction gas is directed at it through the top surface which comprises the electrode of the novel cathode. The reaction gas, including one or more elements or compounds of the alloy to be deposited (such as $SiF_4$) and one or more alterant elements (which may include sensitizers and dopants) is ionized by the field applied between the cathode and the substrate to form the plasma.

The rate of deposition of the semiconductor material from the plasma onto the substrate 10 is a function of a number of variables, the control of each of which is closely regulated throughout the system. As mentioned, substrate temperature is maintained at between 250 and 300 degrees Centigrade, while the monitoring of layer thickness serves to monitor and control a number of process variables. In addition, applicants have found that a "low power," "low frequency" plasma generally contributes to depositing alloys of superior performance characteristics. While the technology of layer deposition from a plasma is new and not yet fully understood, it appears that a low kinetic energy of the depositing molecules which is attained in a low power environment favors formation of a deposited structure having the least amount of defects.

Applicants have developed a number of low power (requiring about 0.1 watt/cm$^2$, as opposed to 1 watt/cm$^2$ for plasma generation) techniques for use in a system according to the present invention. These techniques generally result in a deposition which produces layers of improved properties and uniformity of thickness and chemical and structural composition.

It is believed that resonance phenomena associated with high frequency fields (such as the 13.56 MHz commonly employed for sputter and prior art glow discharge deposition) may induce oscillation of electrons within the plasma. Such resonance may prevent the electrons from travelling across the gap between the cathode and the substrate to ionize reaction gases in the vicinity of the substrate.

The desirability of low power, low frequency generation of the deposition plasma has been empirically investigated by the Applicants. They have found that, when a plasma was generated at a frequency of 13.56 MHz, significant plasma color nonuniformity was observed which indicates a lack of uniformity of the chemistry within the plasma region. It is believed that nonuniformity of the plasma color is due to the excitation of different species of the reaction gas at different points. It was observed that at the higher frequency, 13.56 MHz, the plasma color at the position close to the gas inlet was blue whereas the color of the plasma close to the outlet was reddish. A higher deposition rate was observed in the blue region than in the reddish region. In contrast, it has been found that a plasma formed of reaction gas interacting with an electric field at 75 kHz possesses uniform color and hence deposits a layer of amorphous material of relatively uniform thickness. Layers of quite uniform composition can be obtained from plasmas generated by electric fields in the frequency range of about 50 kHz to about 200 kHz.

In addition to plasma and layer uniformity, it has been observed that silicon material deposited at 13.56 mHz is characterized by internal tensile stresses, while that deposited in the lower frequency range exhibits reduced internal stresses. Tensile stress is believed to cause the occasional peeling of deposited layers observed in the past. Thus, the structure and adhesion of the layers is enhanced by low frequency, low power deposition techniques.

Applicants have found that the deposition of intrinsic silicon exhibiting very favorable photoluminescence and photoconductivity is enhanced even at the relatively high frequency of 13.56 MHz when a quantity of inert gas such as Ar, Ne or He is introduced into the mixture of reaction gas as a diluent. In particular, favorable results were observed when equal amounts of argon and a mixture of $SiF_4$ and $H_2$ (in their customary ratio of 4-9:1) were combined. Here it is theorized that the energy profile of the plasma is significantly altered by the inclusion of the inert gas. The interaction of the depositing gas with the various energy states of the ionized inert gas could easily enhance the formation of plasma species favorable to the desired deposition. Thus, the inert gas acts as a kind of intermediate energy buffer to produce a plasma with a profile of energies and species needed for efficient deposition of high quality amorphous Si alloys. (By the term "amorphous" is meant an alloy or material which has long range disorder, although it may have short or intermediate order or even contain at times some crystalline inclusions).

Thus it is seen that there has been brought to the semiconductor processing art new apparatus for maintaining a substrate at a predetermined deposition temperature as it travels through a glow discharge chamber. One may utilize the concepts and apparatus of the present invention to achieve optimal deposition of amorphous semiconductor material from a plasma generated therein by selecting a desired substrate temperature. The substantial uniformity of substrate temperature as it advances through the chamber enhances the uniformity of the resultant deposition from the plasma.

What is claimed is:

1. Apparatus for heating a continuous substrate to a predetermined deposition temperature as it travels through at least one glow discharge chamber, said apparatus comprising:

a heater, said heater including a plurality of heater lamps within said glow discharge chamber spaced along the direction of travel of said substrate, the spacing between adjacent lamps increasing along said direction of travel so that the temperature of said continuous substrate is rapidly heated to and maintained at said predetermined deposition temperature as it travels through said chamber;

a detector for monitoring the temperature of said substrate, said detector including means responsive to infrared radiation of about 5 microns in wavelength; and a feedback control circuit coupled to said detector for adjusting the intensity of said lamps in response to the temperature of said substrate, said circuit being responsive to the output of said detector to produce a signal to control the intensity of each of said lamps.

2. Apparatus as defined in claim 1 wherein said detector is an optical pyrometer.

3. Apparatus as defined in claim 1 wherein said detector is a thermocouple.

4. Apparatus as defined in claim 1 further including a plurality of said glow discharge chambers interconnected with one another and said substrate traveling therethrough.

* * * * *

UNITED STATES PATENT AND TRADEMARK OFFICE
CERTIFICATE OF CORRECTION

PATENT NO. : 4,389,970
DATED : June 28, 1983
INVENTOR(S) : Robert F. Edgerton

It is certified that error appears in the above-identified patent and that said Letters Patent is hereby corrected as shown below:

Column 1, line 52, delete "useable" and insert --usable--.
Column 1, line 63, delete "Canella" and insert --Cannella--.
Column 4, line 40, delete "infra red" and insert --infrared--.
Column 4, line 48, delete "infra" and insert --infra--.
Column 5, line 68, delete "plasma/-" and insert --plasma/--.
Column 7, line 2, delete "infra red" and insert --infrared--.
Column 7, line 9, delete "degress" and insert --degrees--.
Column 7, line 19, delete "infra red" and insert --infrared--.
Column 7, line 46, delete "microprocesser" and insert --microprocessor--.
Column 11, line 52, delete "mHz" and insert --MHz--.

Signed and Sealed this

Eighth Day of May 1984

[SEAL]

Attest:

GERALD J. MOSSINGHOFF

Attesting Officer

Commissioner of Patents and Trademarks